United States Patent
Wong et al.

(10) Patent No.: US 6,593,862 B1
(45) Date of Patent: Jul. 15, 2003

(54) METHOD FOR LOSSILY COMPRESSING TIME SERIES DATA

(75) Inventors: Joseph D. Wong, Roseville, CA (US); Scott F. Truesdale, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/109,426

(22) Filed: Mar. 28, 2002

(51) Int. Cl.$^7$ .................................................. H03M 7/30
(52) U.S. Cl. ............................................. 341/87; 341/50
(58) Field of Search ................................ 341/87, 50, 51

(56) References Cited

U.S. PATENT DOCUMENTS 4,926,482 A  *  5/1990  Frost et al. ................... 381/31

FOREIGN PATENT DOCUMENTS

US    2003/0007695 A1 *  1/2003    .................. 382/239

OTHER PUBLICATIONS

P. Wayner, "Compression Algorithms for Real Programmers", Morgan Kaufmann, San Diego, CA, pp. 85–93 and 160–167, 2000.

\* cited by examiner

Primary Examiner—Peguy JeanPierre
Assistant Examiner—Joseph Lauture

(57) ABSTRACT

A method is provided for lossily compressing time series data that is collected from a storage area network. The method includes: determining the resolution of an output device that may be used to output a representation of the time series data; determining a sampling block size that is in part based on the resolution of the output device; partitioning the plurality of data points into a plurality of data blocks in accordance with the sampling block size; and applying retention criteria to each of the plurality of data blocks, thereby compressing the time series data to be output by the output device.

16 Claims, 4 Drawing Sheets

METHOD FOR LOSSILY COMPRESSING TIME SERIES DATA

FIELD OF THE INVENTION

The present invention relates generally to a software-implemented diagnostic tool for assessing performance of storage area networks and, more particularly, to a method for lossily compressing time series data collected from storage area networks.

BACKGROUND OF THE INVENTION

Software-implemented diagnostic tools are currently being developed to assess the performance of storage area networks and other network topologies. Many factors can affect network performance. Some of these factors include hardware parameters, such the amount of cache and the number of control processors; connectivity issues; software issue; and a multitude of network configuration settings, including RAID levels, LUN layout, LUN size, and LUN contention. Since network performance may be affected by one or more of these factors at the same time, diagnostic tools must assess each of the factors that may possibly affect performance.

To perform such an assessment, diagnostic tools collect and analyze large amounts of performance measurement data indicative of these different factors. In many instances, the performance measurement data is in the form of time series data that needs to be compressed into more manageable amounts of data.

Although techniques for lossily compressing time series data are generally known, it is desirable to provide an improved method for lossily compressing time series data that is collected from a storage area network.

SUMMARY OF THE INVENTION

In accordance with the present invention, a method is provided for lossily compressing time series data that is collected from a storage area network. The method includes: determining the resolution of an output device that may be used to output a representation of the time series data; determining a sampling block size that is in part based on the resolution of the output device; partitioning the plurality of data points into a plurality of data blocks in accordance with the sampling block size; and applying retention criteria to each of the plurality of data blocks, thereby compressing the time series data to be output by the output device.

For a more complete understanding of the invention, its objects and advantages, reference may be had to the following specification and to the accompanying drawings.

DETAILED DESCRIPTION OF THE PREFERRED EMBODIMENTS

Figure 1:
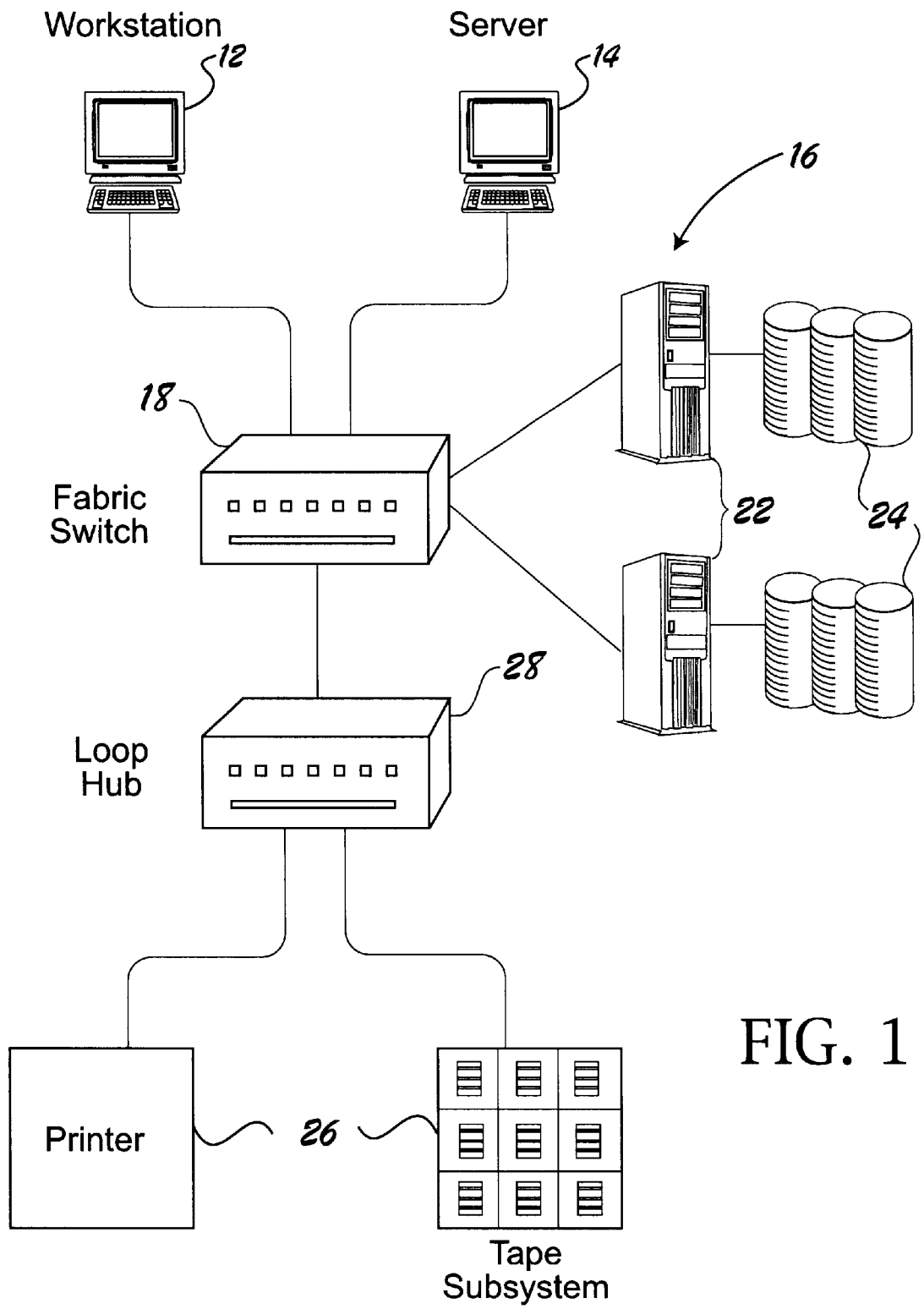
FIG. 1 is a block diagram of an exemplary topology for a storage area network in accordance with the present invention.

FIG. 1 illustrates an exemplary topology for a storage area network 10. The storage area network 10 combines a fabric switch topology with an arbitrated loop topology as is well known in the art. Specifically, the storage area network 10 includes a workstation 12, a server 14, and a disk array 16 interconnected by a fabric switch 18. The disk array 16 may be further defined to include one or more Redundant Arrays of Independent Disk (RAID) controllers 22 and a plurality of disk drive units 24. In addition, the storage area network 10 may also includes a plurality of sequentially streaming output devices 26 (e.g., a printer, a tape drive subsystem, or a digital media output subsystem) connected to the fabric switch 18 via an arbitrated loop hub 28. While the following description is provided with reference to a storage area network, it is readily understood that the present invention is applicable to other network topologies.

Figure 2:
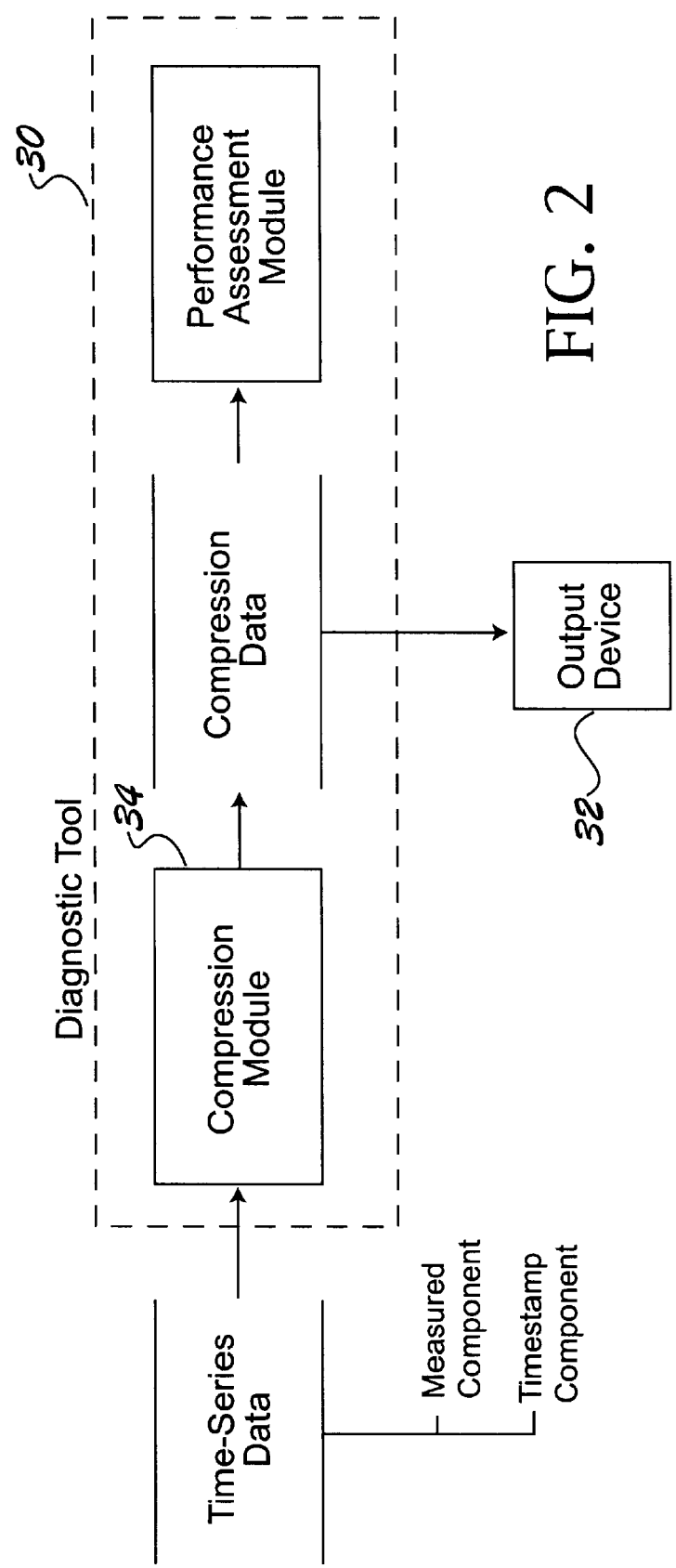
FIG. 2 is a block diagram of an exemplary diagnostic tool that may be used to assess performance of the storage area network.

A software-implemented diagnostic software tool 30 may be used to collect and assess performance data associated with the storage area network as shown in FIG. 2. In operation, the diagnostic tool 30 systematically isolates performance bottlenecks in the storage area network and, if applicable, implements corrective actions to relieve the isolated bottlenecks. In addition, the diagnostic tool 30 generates performance reports that are output by an output device 32 associated with the diagnostic tool. The output device 32 is preferably graphical plotting software that assists in visualizing quantitative data by converting data values into pixels for a visual display device or a software representation for a hardcopy device. However, it is envisioned that other types of output devices, such as the visual display device or the printer, are also within the scope of the present invention.

To perform such an assessment, the diagnostic tool 30 receives time series data 32 from numerous input data sources associated with the network. Time series data is understood to be any volatile performance parameter that is repeatedly monitored or collected over a period of time at a particular sampling frequency. The time series data preferably includes a measured component and a timestamp component indicative of the time at which the measured component was taken. The timestamp component may be expressed in different formats (e.g., U.S. date format, European date format, neutral format, etc.) as is well known in the art.

In the context of assessing network performance, exemplary time series data may include performance measurements from each of the RAID controllers, such as the percentage utilization of its processor. In another example, time series data may include performance measurements from each of the disk drive units, such as the total number of read and write I/O operations, total number of sequential I/O operations, total number of random I/O operations, the total number of random read operations, the total number of random write operations, the total number of sequential read operations, and/or the total number of sequential write operations each taken over some predetermined period of time. It is readily understood that other types and sources of time series data, including but not limited to cached I/O operations, cache hit percentages, cache to drive I/O operations, drive to cache I/O operations, bus adapter utilization, switch port utilization, and array controller utilization, are within the scope of the present invention.

Figure 3:
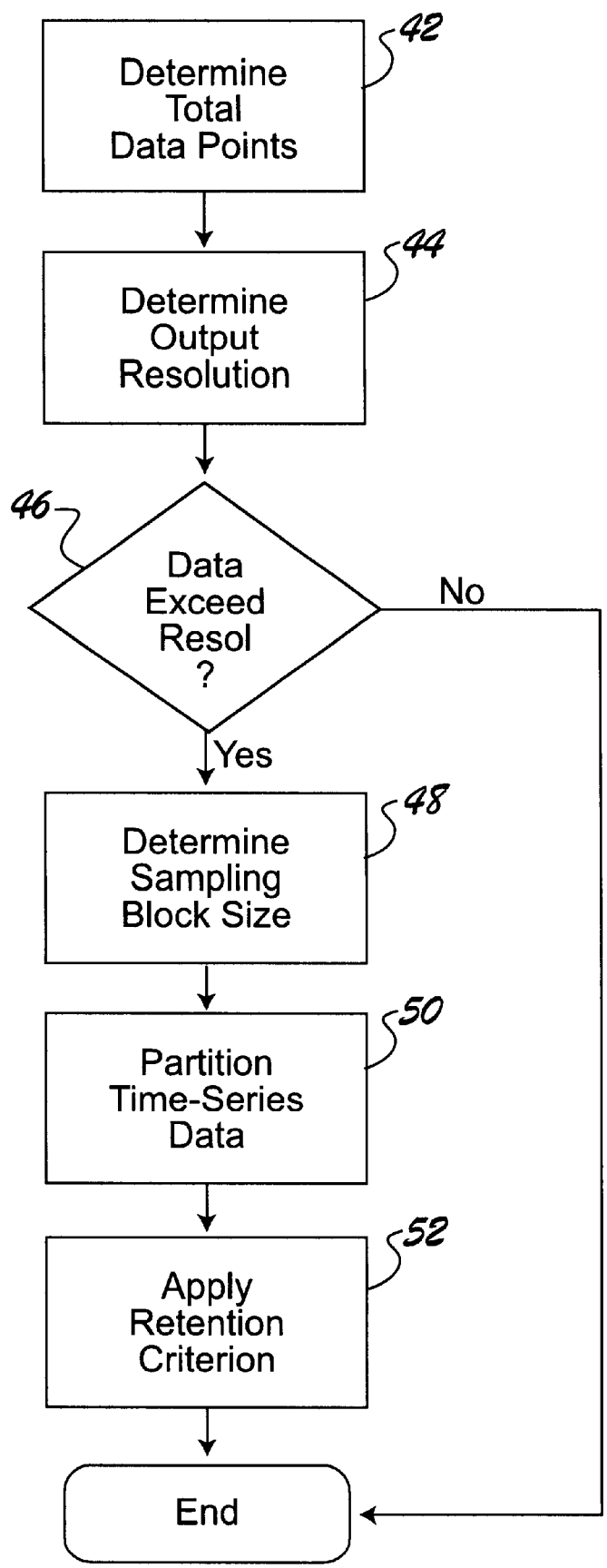
FIG. 3 is a flowchart of a method for lossily compressing time series data collected from the storage area network in accordance with the present invention.

In accordance with the present invention, a method is provided for lossily compressing time series data that may be received by the diagnostic tool 30. An exemplary embodiment of the methodology is depicted in FIG. 3. Although the methodology is preferably implemented as a compression module 32 within the diagnostic software tool, it is to be understood that only the relevant steps of the methodology are discussed in FIG. 3 and that other software-implemented instructions may be needed to control and manage the overall operation of the diagnostic tool. In addition, it is also to be understood that the compression methodology of the present invention may be employed independently or in conjunction with other known compression algorithms.

First, the diagnostic tool 30 determines if it is necessary to perform the compression algorithm for a given set of time series data. To do so, the total number of data points in the given set of time series data is determined at step 42. Since the amount of time series data typically exceeds the granularity of most conventional output devices, this determination is tied to the resolution of the output device 32 employed by the diagnostic software 30. Thus, the resolution of the output device that is to be used to represent the time series data is determined at step 44. Of particular interest, the resolution is determined along the axis of the output device used to represent time. One skilled in the art will readily recognize that various techniques may be employed to determine the resolution, including (but not limited to) retrieving a predetermined resolution value from a look-up table and programmatically inquiring the output device for a resolution value.

The total number of data points is then compared to the resolution of the output device at step 46. When the number of data points exceeds the resolution of the output device, it is necessary to lossily compress the time series data. On the other hand, when the number of data points does not exceed the resolution of the output device, the compression algorithm is not performed.

The compression algorithm of the present invention also accounts for the resolution of the output device. For instance, the sampling block size is in part based on the resolution of the output device as shown at step 48. The sampling block size is also based on the number of data points that are retained in accordance with the subsequently applied retention criteria. In a one exemplary embodiment, the sampling block size is calculated as follows: sampling block size=total number of data points/(resolution of the output device * number of data points retained in accordance with the retention criteria). This results in a direct correlation between the total number of retained data points and the resolution of the output device. In a non-divisible scenario, the sampling block is rounded up to the nearest integer. In the case of the last partition of time series data is too small to contain the retention criteria, then the sampling block is increased to the next largest integer value. At step 50, the sampling block size is further used to partition the time series data into a plurality of data blocks.

Retention criteria is then applied to each of the data blocks at step 52. The retention criteria identifies the data points that are to be retained from a given data block; whereas the remaining data points in the data block are discarded. Exemplary retention criteria may include identifying an extrema pair (i.e., maximum value and minima value) for a given data block, randomly selecting one or more representative data points from a given data block, determining an average value for a given data block, or determining a modal value for a given data block. It is envisioned that other retention criteria, such as a median value and an accumulation value, are also within the broader aspects of the present invention.

An overall retention criterion may be developed from one or more of the retention criteria described above. Since it is important to identify the performance aberrations within the network, retaining the extrema pair data is preferably one of the retention criteria used in the overall retention criterion that is applied to each of the data blocks. However, it is to be understood that the overall retention criterion may vary depending on the type of time series data being compressed. By applying the overall retention criterion to each of the data blocks, the time series data is lossily compressed.

To further illustrate the compression algorithm of the present invention, a specific example is set forth. In this example, the time series data includes 20,000 data points which are to be displayed on a display device having 400 pixels of resolution. The overall retention criterion includes identifying an extrema pair, determining an average value and determining a modal value. In other words, four (4) data points are to be retained from each sampled data block.

In accordance with the exemplary embodiment, the sampling block size is computed to be (20,000/400 * 4=) 200 data points. Accordingly, the time series data is partitioned into (20,000/200=) 100 data blocks. The overall retention criterion is applied to each of these data blocks. Since four data points are retained from each of the data blocks, the time series data is lossily compressed to 400 data points.

In another aspect of the present invention, the compression algorithm may optionally apply a filter to each of the data blocks before applying the retention criterion. The filter is intended to ensure that each of the data points in an given data block fall within an expected time interval. As will be further described below, data points falling outside of the expected time interval may be shifted to an adjacent data block.

Figure 4:
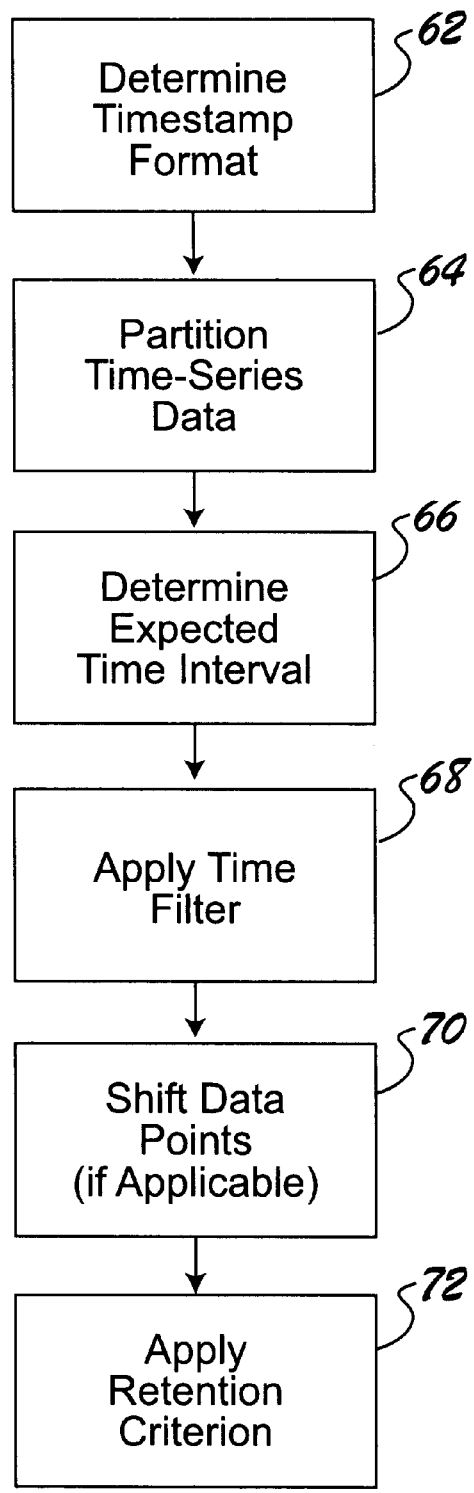
FIG. 4 is a flowchart illustrating how an exemplary filtering process may be incorporated into the compression algorithm of the present invention.

FIG. 4 illustrates how this filtering process is incorporated into the previously described compression algorithm. Prior to partitioning the time series data, the format for the timestamp component is first determined as noted at step 62. One skilled in the art will readily recognize that various techniques may be employed to identify the format of the timestamp component.

Next, the time series data is partitioned into a plurality of data blocks at step 64. At step 66, an expected time interval, $t_e$, is determined for the plurality of data blocks. For a given data block, its time interval may be computed by subtracting the timestamp component for a first data point in the data block from the timestamp component for the last data point in the data block. An expected time interval for each of the data blocks is then derived from the actual time interval associated with one or more of the data blocks. For instance, the expected time interval may be set to the actual time interval from a randomly selected data block. Additional data blocks may be randomly selected to verify the accuracy of the expected time interval. Although this technique is presently preferred, other techniques for determining an expected time interval for the data blocks are also with the scope of the present invention.

The expected time interval is then used at step 68 as a filter for the data points in each of the data blocks. Preferably, the timestamp value for the first data point, $t_1$, in the first data block is used as the starting point. Data points associated with the first data block should have a timestamp value falling within the time interval defined between $t_1$ and $t_1+t_e$. In step 70, one or more of the data points falling outside of this time interval are shifted to the next data block. Conversely, one or more data points associated with the second data block but having a timestamp value that falls within this time interval are shifted from the second data block to the first data block. Lastly, the retention criterion is applied as described above to the data points falling within this time interval as noted at step 72. It should be noted that in the case of the second data block, the applicable time interval is defined between $t_1+t_e$ and $t_1+2t_e$. Similar time intervals are defined for each of the remaining data blocks, but otherwise the above-described process is repeated for each of the data blocks. In this way, the time series data undergoes an additional integrity check as part of the compression algorithm.

Although the above filtering process is presently preferred, it is envisioned that other filters may also be applied to the time series data. For instance, the time series data may be sorted by time of day, where the data portion of the timestamp component is ignored. The compression algorithm as set forth above can then be applied to the sorted time series data. In this way, the compressed time series data is.grouped around time-of-day for further assessment.

While the invention has been described in its presently preferred form, it will be understood that the invention is capable of modification without departing from the spirit of the invention as set forth in the appended claims.

What is claimed is:

1. A method for lossily compressing time series data having a plurality of data points, comprising:
   determining a resolution of an output device that may be used to output a representation of the time series data,
   determining a sampling block size that is in part based on the resolution of the output device;
   partitioning the plurality of data points into a plurality of data blocks in accordance with the sampling block size; and
   applying retention criteria to each of the plurality of data blocks, thereby compressing the time series data to be output by the output device.

2. The method of claim 1 wherein the step of applying retention criteria further comprises retaining data points for a given data block derived in accordance with the retention criteria and discarding the remaining data points in the given data block.

3. The method of claim 1 wherein the step of applying retention criteria further comprises defining the retention criteria as one or more selected from the group comprising: identifying an extrema pair within a given data block, randomly selecting one or more representative data points in the given data block, determining an average value for the given data block, and determining a modal value for the given data block.

4. The method of claim 1 further comprising the steps of:
   determining the number of data points associated with the time series data, prior to the step of determining a sampling block size; and
   performing the determining a sampling block size, partitioning and applying retention criteria steps when the number of data points exceeds the resolution of output device.

5. The method of claim 1 wherein the step of determining a sampling block size further comprises determining the number of data points to be retained for each data block in accordance with the retention criteria, and computing the sampling block size based on the resolution of the output device and the number of data points retained in accordance with the retention criteria.

6. The method of claim 1 further comprising the steps of:
   determining an expected time interval for the plurality of data blocks; and
   applying the expected time interval to the data points in a given data block, where each of the plurality of data points is defined to include a measured component and a timestamp component indicative of the time at which the measured component was taken; and
   applying the retention criteria to the data points in the given data block that fall within the expected time interval.

7. The method of claim 6 wherein the step of determining an expected time interval further comprises selectively identifying a subset of the plurality of data blocks, calculating a time interval for each of the subset from the data blocks, and setting the expected time interval based on the calculated time intervals from the subset.

8. The method of claim 7 wherein the step of calculating a time interval further comprises subtracting the timestamp component associated with a first data point in a given data block from the timestamp component associated with the last data point in the given data block.

9. The method of claim 6 wherein the step of applying the expected time interval to the data points in a given data block further comprise s shifting one or more data points to an adjacent data block when the one or more data points fall outside o f the expected time interval.

10. A method for lossily compressing time series data having a plurality of data points, comprising:
    determining a sampling block size;
    partitioning the plurality o f data points into a plurality of data blocks in accordance with the sampling block size; and
    applying a retention criterion to each of the plurality of data blocks, where the step of applying retention criterion further includes identifying an extrema pair within a given data block, retaining the extrema pair for the given data block and discarding the remaining data points in the given data block.

11. The method of claim 10 wherein the step of applying retention criterion further comprises defining a retention criterion to include one or more retention criteria selected from the group comprising: randomly selecting one or more representative data points in the given data block, determining an average value for the given data block, and determining a modal value for the given data block.

12. The method of claim 10 further comprising the step of determining a resolution of an output device that may be used to output a representation of the time series data.

13. The method of claim 12 further comprising the steps of:
    determining the number of data points associated with the time series data, prior to the step of determining a sampling block size; and
    performing the, determining a sampling block size, partitioning and applying retention criteria steps when the number of data points exceeds the resolution of the output device.

14. The method of claim 12 wherein the step of determining a sampling block size further comprises determining the number of data points to be retained for each data block in accordance with the retention criterion, and computing the sampling block size based on the resolution of the output device and the number of data points retained in accordance with the retention criterion.

15. The method of claim 10 further comprising the steps of:
 determining an expected time interval for the plurality of data blocks; and
 applying the expected time interval to the data points in a given data block, where each of the plurality of data points is defined to include a measured component and a timestamp component indicative of the time at which the measured component was taken; and
 applying the retention criterion to the data points in the given data block that fall within the expected time interval.

16. The method of claim 15 wherein the step of applying the expected time interval to the data points in a given data block further comprises shifting one or more data points to an adjacent data block when said one or more data points fall outside of the expected time interval.

* * * * *

UNITED STATES PATENT AND TRADEMARK OFFICE
CERTIFICATE OF CORRECTION

PATENT NO.    : 6,593,862 B1
DATED         : July 15, 2003
INVENTOR(S)   : Jospeh D. Wong et al.

It is certified that error appears in the above-identified patent and that said Letters Patent is hereby corrected as shown below:

<u>Column 6,</u>
Line 13, after "the" delete "subset of"
Line 13, after "blocks" insert -- from the subset --
Line 24, delete "comprise s" and insert therefor -- comprises --
Line 31, delete "o f" and insert therefor -- of --

Signed and Sealed this

Twenty-second Day of March, 2005

JON W. DUDAS
*Director of the United States Patent and Trademark Office*